(12) United States Patent
Choi et al.

(10) Patent No.: US 11,721,565 B2
(45) Date of Patent: Aug. 8, 2023

(54) MULTI-CHAMBER APPARATUS

(71) Applicant: SAMSUNG ELECTRONICS CO., LTD., Suwon-si (KR)

(72) Inventors: Yong Jun Choi, Suwon-si (KR); Seok Hoon Kim, Suwon-si (KR); Young-Hoo Kim, Suwon-si (KR); In Gi Kim, Suwon-si (KR); Sung Hyun Park, Suwon-si (KR); Seung Min Shin, Suwon-si (KR); Kun Tack Lee, Suwon-si (KR); Jinwoo Lee, Suwon-si (KR); Hun Jae Jang, Suwon-si (KR); Ji Hoon Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 16/690,498

(22) Filed: Nov. 21, 2019

(65) Prior Publication Data
US 2020/0343113 A1 Oct. 29, 2020

(30) Foreign Application Priority Data
Apr. 26, 2019 (KR) .......................... 10-2019-0048933

(51) Int. Cl.
*H01L 21/67* (2006.01)
*H01L 21/687* (2006.01)
*B08B 3/08* (2006.01)

(52) U.S. Cl.
CPC .......... *H01L 21/67167* (2013.01); *B08B 3/08* (2013.01); *H01L 21/67034* (2013.01); *H01L 21/67051* (2013.01); *H01L 21/67063* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 6,841,031 B2* | 1/2005 | Iwata | C03C 23/0085 156/345.22 |
| 7,000,621 B1 | 2/2006 | Verhaverbeke | |
| 10,068,781 B2 | 9/2018 | Sirard et al. | |
| 2003/0045098 A1* | 3/2003 | Verhaverbeke | H01L 21/67173 438/689 |
| 2003/0084918 A1 | 5/2003 | Kim | |
| 2003/0136514 A1* | 7/2003 | Biberger | H01L 21/67167 156/345.31 |
| 2010/0192992 A1* | 8/2010 | Toshima | H01L 21/67057 414/222.01 |

(Continued)

FOREIGN PATENT DOCUMENTS

| | | |
|---|---|---|
| KR | 10-1156742 B1 | 6/2012 |
| KR | 2015-0088829 A | 8/2015 |

OTHER PUBLICATIONS

Korean Office action dated May 25, 2023.

*Primary Examiner* — Sylvia MacArthur
(74) *Attorney, Agent, or Firm* — Lee IP Law, P.C.

(57) ABSTRACT

A multi-chamber apparatus for processing a wafer, the apparatus including a high etch rate chamber to receive the wafer and to etch silicon nitride with a phosphoric acid solution; a rinse chamber to receive the wafer and to clean the wafer with an ammonia mixed solution; and a supercritical drying chamber to dry the wafer with a supercritical fluid.

8 Claims, 10 Drawing Sheets

(56) References Cited

U.S. PATENT DOCUMENTS

| | | | |
|---|---|---|---|
| 2010/0223805 A1* | 9/2010 | Hyakutake | H01L 21/67769 34/427 |
| 2012/0006356 A1* | 1/2012 | Kamikawa | H01L 21/67051 134/10 |
| 2012/0034485 A1* | 2/2012 | Lyubomirskiy | E04F 13/0871 428/173 |
| 2012/0064727 A1 | 3/2012 | Oh et al. | |
| 2012/0304485 A1* | 12/2012 | Hayashi | H01L 21/02057 257/E21.328 |
| 2013/0318812 A1* | 12/2013 | Kim | F26B 21/12 34/201 |
| 2014/0020721 A1* | 1/2014 | Hayashi | H01L 21/02057 134/102.2 |
| 2014/0144462 A1* | 5/2014 | Verhaverbeke | H01L 21/67126 134/1.2 |
| 2015/0332940 A1 | 11/2015 | Wang et al. | |
| 2016/0351412 A1* | 12/2016 | Lee | H01L 21/6708 |
| 2018/0138035 A1* | 5/2018 | Ohno | H01L 21/02057 |
| 2020/0343113 A1* | 10/2020 | Choi | H01L 21/68792 |

* cited by examiner

MULTI-CHAMBER APPARATUS

CROSS-REFERENCE TO RELATED APPLICATION

Korean Patent Application No. 10-2019-0048933, filed on Apr. 26, 2019, in the Korean Intellectual Property Office, and entitled: "Multi-Chamber Equipment," is incorporated by reference herein in its entirety.

BACKGROUND

1. Field

Embodiments relate to a multi-chamber apparatus.

2. Description of the Related Art

As the NAND flash memory generation progresses, the number of tiers in which chips are stacked in a device may increase. With the increase in the number of tiers and the reduction in design rules, some drying processes performed using isopropyl alcohol while rotating a wafer may be reaching the limit in terms of the occurrence of pattern leaning. Accordingly, supercritical drying may be performed using a supercritical fluid.

In addition, a wafer cleaning process for removing silicon nitride of a NAND flash device may be performed in a batch type in which a wafer is immersed in a bath. Some supercritical drying apparatuses may be of a single type, rather than a batch type. An apparatus may perform a wafer cleaning process and a supercritical drying process at once.

SUMMARY

The embodiments may be realized by providing a multi-chamber apparatus for processing a wafer, the apparatus including a high etch rate chamber to receive the wafer and to etch silicon nitride with a phosphoric acid solution; a rinse chamber to receive the wafer and to clean the wafer with an ammonia mixed solution; and a supercritical drying chamber to dry the wafer with a supercritical fluid.

The embodiments may be realized by providing a multi-chamber apparatus for processing a wafer, the apparatus including at least one high etch rate chamber to receive the wafer and to etch silicon nitride with a chemical at a first temperature; at least one rinse chamber to receive the wafer and to clean the wafer with a chemical at a second temperature that is lower than the first temperature; at least one supercritical drying chamber to dry the wafer with a supercritical fluid; a housing in which the at least one high etch rate chamber, the at least one rinse chamber, and the at least one supercritical drying chamber are located; and a robot arm in the housing to move the wafer to the at least one high etch rate chamber, the at least one rinse chamber, and the at least one supercritical drying chamber.

The embodiments may be realized by providing a multi-chamber apparatus for processing a wafer, the apparatus including at least one first chamber; at least one second chamber; at least one third chamber; a transfer zone outside the at least one first chamber, the at least one second chamber, and the at least one third chamber; a buffer zone outside the at least one first chamber, the at least one second chamber, and the at least one third chamber and connected to the transfer zone; and a driver to move the wafer, wherein the driver moves the wafer from the buffer zone to the at least one first chamber, moves the wafer to the at least one second chamber via the transfer zone after an etching process is performed on the wafer using a phosphoric acid solution in the at least one first chamber, moves the wafer to the at least one third chamber via the transfer zone after a cleaning process is performed on the wafer using an ammonia mixed solution in the at least one second chamber, and moves the wafer to the buffer zone after a supercritical drying process is performed on the wafer in the at least one third chamber.

BRIEF DESCRIPTION OF THE DRAWINGS

Features will be apparent to those of skill in the art by describing in detail exemplary embodiments with reference to the attached drawings in which.

DETAILED DESCRIPTION

A multi-chamber apparatus according to embodiments will now be described with reference to FIGS. 1 and 2.

Figure 1:
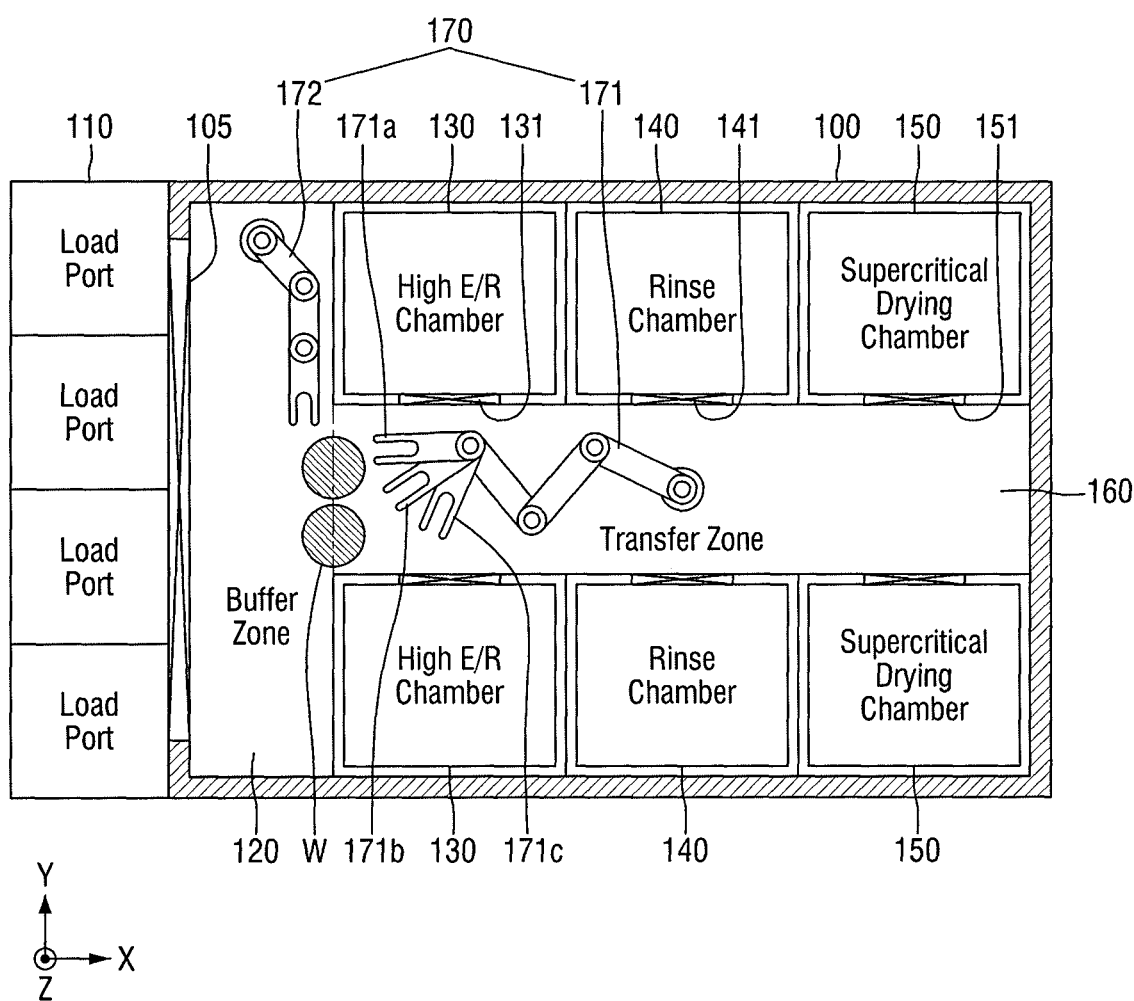
FIG. 1 illustrates a plan view of a multi-chamber apparatus according to embodiments.

FIG. 1 illustrates a plan view of a multi-chamber apparatus according to embodiments. FIG. 2 illustrates a side view of the multi-chamber apparatus of FIG. 1. Referring to FIGS. 1 and 2, the multi-chamber apparatus according to the embodiments may include a housing 100, an opening and closing portion 105, a load port 110, a buffer zone 120, a high etch rate chamber 130, a rinse chamber 140, a supercritical drying chamber 150, a transfer zone 160, and a driver 170. A first direction X may be any one of horizontal directions. A second direction Y may be any one of horizontal directions different from the first direction X. The second direction Y may intersect the first direction X. For example, the second direction Y may be perpendicular to the first direction X. A third direction Z may be a direction intersecting the first direction X and the second direction Y. For example, the third direction Z may be a direction perpendicular to both the first direction X and the second direction Y. The third direction Z may be, e.g., a vertical direction. Accordingly, the first direction X, the second direction Y, and the third direction Z may be orthogonal to each other.

For example, the multi-chamber apparatus according to the embodiments may have a structure in which a plurality of chambers are stacked in the third direction Z. In an implementation, as illustrated in FIGS. 1 and 2, the multi-chamber apparatus may include, e.g., twelve chambers. In the multi-chamber apparatus, six chambers arranged in plan view as illustrated in FIG. 1 may be stacked in two tiers. The multi-chamber apparatus of FIGS. 1 and 2 may include four high etch rate chambers 130, four rinse chambers 140, and four supercritical drying chambers 150. For example, FIG. 2 may be a side layout of the multi-chamber apparatus whose chambers are stacked in two tiers in the third direction Z.

Figure 2:
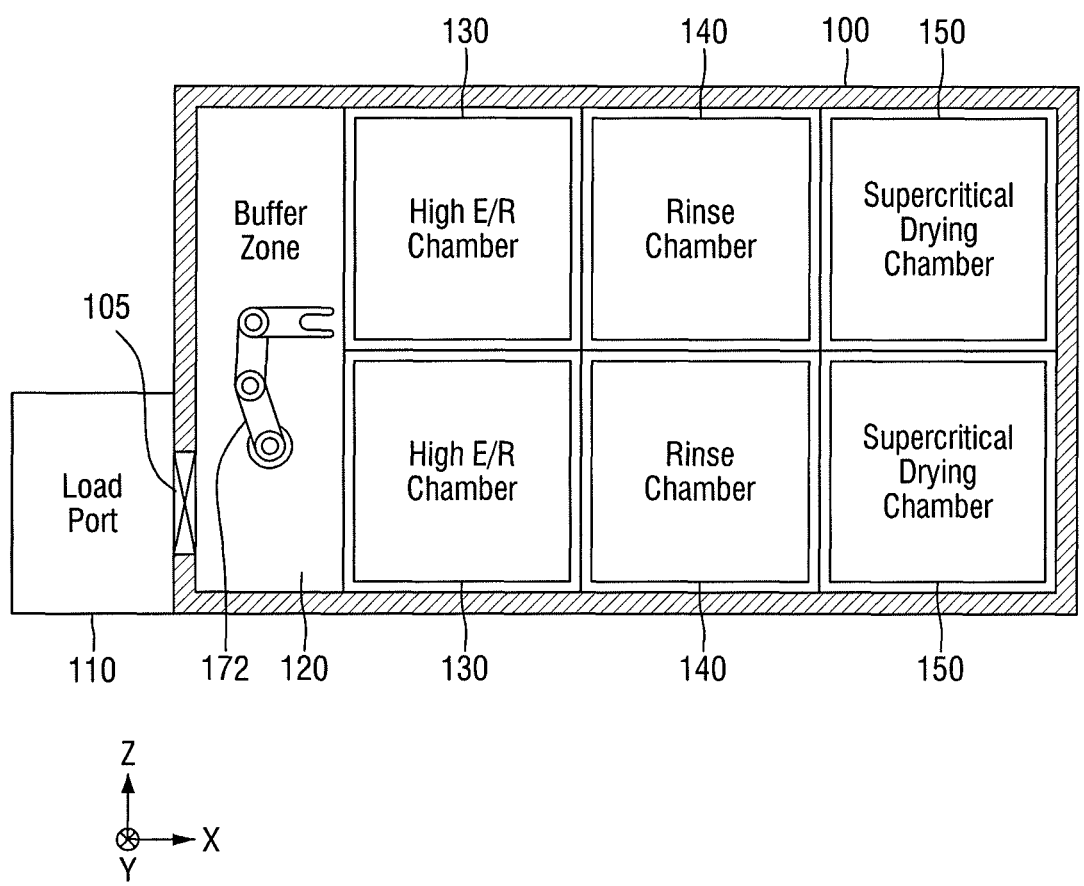
FIG. 2 illustrates a side view of the multi-chamber apparatus of FIG. 1.

Referring to FIGS. 1 and 2, the housing 100 may contain the high etch rate chamber 130, the rinse chamber 140, the supercritical drying chamber 150, the buffer zone 120, the transfer zone 160, and the driver 170. For example, the housing 100 may form outer walls of the multi-chamber apparatus according to the embodiments.

In an implementation, the housing 100 may have a rectangular parallelepiped shape, as illustrated in FIGS. 1 and 2. In an implementation, the shape of the housing 100 may vary according to needs and purposes.

The opening and closing portion 105 may be at a side of the housing 100. The opening and closing portion 105 may be a passage through which a wafer W is put into the housing 100 or removed from the housing 100 (e.g., the wafer W may be insertable and/or removable through the opening and closing portion). The opening and closing portion 105 may be closed to seal the housing 100. In an implementation, the opening and closing portion 105 may be temporally opened when the wafer W is put into the housing 100.

In an implementation, the apparatus may include, e.g., one, opening and closing portion 105, as illustrated in FIGS. 1 and 2.

The load port 110 may be outside the housing 100. The load port 110 may be a place where a wafer W waits for a while (e.g., for a predetermined time) before being put into the housing 100. A plurality of wafers W may be placed in the load port 110 before being put into the housing 100. In an implementation, the wafers W may be placed in a stacked state.

The load port 110 may be provided in plural numbers. In an implementation, as illustrated in FIG. 1, four load ports 110 may be present. In an implementation, a plurality of stacked wafers W may be placed in each of the load ports 110.

The buffer zone 120 may be inside the housing 100. The buffer zone 120 may be a place where a wafer W put into the housing 100 is first placed. The wafer W may be transferred from the load port 110 to the buffer zone 120 by a second robot arm 172. The second robot arm 172 may move the wafer W in the first direction X, the second direction Y, and the third direction Z.

For example, the wafer W may be placed between the buffer zone 120 and the transfer zone 160. This may facilitate transfer of the wafer W. For example, the buffer zone 120 may be connected to the transfer zone 160, and the wafer may be accommodatable in the buffer zone 120 for a predetermined time period before being moved to the high etch rate chamber 130, the rinse chamber 140, or the supercritical drying chamber 150.

The high etch rate chamber 130 may be inside the housing 100. The high etch rate chamber 130 may receive the wafer W. The high etch rate chamber 130 may receive the wafer W through a first opening and closing portion 131 and maintain a sealed environment.

In an implementation, the high etch rate chamber 130 may, e.g., etch silicon nitride ($Si_3N_4$) on the wafer W by using a phosphoric acid ($H_3PO_4$) solution. In an implementation, the temperature of the phosphoric acid solution may be, e.g., 150° C. to 300° C. In an implementation, the high etch rate chamber 130 may clean the wafer W with deionized water after the etching process using the phosphoric acid solution.

The rinse chamber 140 may be inside the housing 100. The rinse chamber 140 may receive the wafer W through a second opening and closing portion 141 and maintain a sealed environment.

In an implementation rinse chamber 140 may, e.g., additionally remove particles remaining on the wafer W by using a phosphoric acid solution and clean the wafer W with an ammonia mixed solution. In an implementation, the ammonia mixed solution may contain, e.g., $NH_4OH:H_2O_2:H_2O$. Next, the rinse chamber 140 may apply isopropyl alcohol (IPA) to the wafer W. Applying the isopropyl alcohol by the rinse chamber 140 may be a pretreatment process prior to a drying process of the supercritical drying chamber 150.

The supercritical drying chamber 150 may be inside the housing 100. The supercritical drying chamber 150 may receive the wafer W through a third opening and closing portion 151 and maintain a sealed environment.

The supercritical drying chamber 150 may dry the wafer W with a supercritical fluid. The supercritical drying chamber 150 may completely dry the wafer W in or from a wet state.

The transfer zone 160 may be adjacent to the outside of the high etch rate chamber 130, the rinse chamber 140, and the supercritical drying chamber 150. The transfer zone 160 may be connected to the buffer zone 120. The transfer zone 160 may be a passage through which the wafer W is transferred to the high etch rate chamber 130, the rinse chamber 140, the supercritical drying chamber 150, and the buffer zone 120. The wafer W may be moved in the transfer zone 160 by a first robot arm 171. The transfer zone 160 may be a place where the first robot arm 171 is installed and moves.

Each of the high etch rate chamber 130, the rinse chamber 140 and the supercritical drying chamber 150 may be provided in plural numbers. In an implementation, the high etch rate chambers 130, the rinse chambers 140 and the supercritical drying chambers 150 may be arranged in the first direction X and the second direction Y. In addition, the high etch rate chambers 130, the rinse chambers 140 and the supercritical drying chambers 150 may be stacked in the third direction Z.

In an implementation, as illustrated in FIG. 1, the high etch rate chambers 130, the rinse chambers 140 and the supercritical drying chambers 150 may be arranged on both sides of the transfer zone 160 in the second direction Y.

The driver 170 may move the wafer W. For example, the driver 170 may move the wafer W to the load port 110, the buffer zone 120, the high etch rate chamber 130, the rinse chamber 140, and the supercritical drying chamber 150.

The driver 170 may include the first robot arm 171 and the second robot arm 172. In an implementation, as illustrated in FIG. 1, the driver 170 may include, e.g., two robot arms. In an implementation, the number of robot arms included in the driver 170 may vary.

In an implementation, the multi-chamber apparatus may also move the wafer W using a medium other than robot arms. For example, the driver 170 may include other media such as a conveyor belt, that can move the wafer W.

The first robot arm 171 may move the wafer W. For example, the first robot arm 171 may move the wafer W from the buffer zone 120 to the high etch rate chamber 130. In an implementation, the first robot arm 171 may move the wafer W from the supercritical drying chamber 150 to the buffer zone 120. The first robot arm 171 may be provided in plural numbers.

The first robot arm 171 may also move the wafer W from the high etch rate chamber 130 to the rinse chamber 140. In an implementation, the first robot arm 171 may move the wafer W from the rinse chamber 140 to the supercritical chamber 150. The first robot arm 171 can move the wafer W in the first direction X, the second direction Y, and the third direction Z.

The second robot arm 172 may move the wafer W from the load port 110 to the buffer zone 120. In an implementation, the second robot arm 172 may move the wafer W from the buffer zone 120 to the load port 110. In an implementation, the second robot arm 172 may move the dried or dry wafer W. The second robot arm 172 may also be provided in plural numbers.

The first robot arm 171 may include a plurality of holds or holders 171a through 171c. In an implementation, as illustrated in FIG. 1, the first robot arm 171 may include, e.g., three holders 171a through 171c. In an implementation, the number of holders 171a through 171c may vary.

In an implementation, the first robot arm 171 may include, e.g., a first holder 171a, a second holder 171b, and a third holder 171c. The first holder 171a may move the wafer W from the buffer zone 120 to the high etch rate chamber 130. The second holder 171b may move the wafer W from the supercritical drying chamber 150 to the transfer zone 160 or the buffer zone 120. The first holder 171a and the second holder 171b may move the dry wafer W.

The third holder 171c may move the wafer W from the high etch rate chamber 130 to the rinse chamber 140 via the transfer zone 160. In addition, the third holder 171c may be used to move the wafer W from the rinse chamber 140 to the supercritical drying chamber 150 via the transfer zone 160. In an implementation, the wafer W may be moved in a wet state in order to prevent a pattern of the wafer W from leaning.

In an implementation, the first holder 171a and the second holder 171b may be two separate holders. In an implementation, they can be used as one holder in the multi-chamber apparatus. For example, the two holders may be used to move a dry wafer W, and they can be used interchangeably. In an implementation, the third holder 171c may not be used interchangeably with other holders.

By moving a dry wafer W and a wet wafer W using different holders as described above, it is possible to help prevent the dry wafer W from getting wet again.

In an implementation, the third holder 171c may be below the first holder 171a and the second holder 171b (e.g., relative to the third direction Z) in order to prevent the dry wafer W from being contaminated by the wet wafer W. For example, it is possible to prevent a liquid dripping from the wet wafer W from reaching the dry wafer W.

A process in which a wafer W passing through the opening and closing portion 105 moves to the high etch rate chamber 130 will now be described. For ease of description, the two-tier multi-chamber apparatus will be described as including a lower chamber area located in a lower tier of a two-tier structure and an upper chamber area located in an upper tier of the two-tier structure.

In an implementation, a wafer W moved from the load port 110 to the buffer zone 120 by the second robot arm 172 may be in a height range of the lower chamber area in the third direction Z. The first robot arm 171 may move to the height range of the lower chamber area in the third direction Z to receive the wafer W from the second robot arm 172 and then may move the wafer W to the high etch rate chamber 130.

In an implementation, the wafer W moved from the load port 110 to the buffer zone 120 by the second robot arm 172 may be located in a height range of the upper chamber area in the third direction Z. The first robot arm 171 may move to the height range of the upper chamber area in the third direction Z to receive the wafer W from the second robot arm 172 and then may move the wafer W to the high etch rate chamber 130.

In an implementation, the wafer W moved from the load port 110 to the buffer zone 120 by the second robot arm 172 may be located at a predetermined height in the third direction Z.

In an implementation, the predetermined height may be a suitable position, which may be allowed in the third direction Z, in the housing 100.

In an implementation, the predetermined height may be within a height range of a chamber area where a high etch rate chamber 130 into which the wafer W can be put after a shortest waiting time among a plurality of high etch rate chambers 130 is located. For example, the predetermined height may be within the height range of the upper chamber area or within the height range of the lower chamber area depending on the progress of processes.

The first robot arm 171 may move to the predetermined height in the third direction Z to receive the wafer W from the second robot 172 and then may move the wafer W to the high etch rate chamber 130.

The sequence of a process performed using the multi-chamber apparatus according to the embodiments will now be described with reference to FIGS. 1 to 3.

Figure 3:
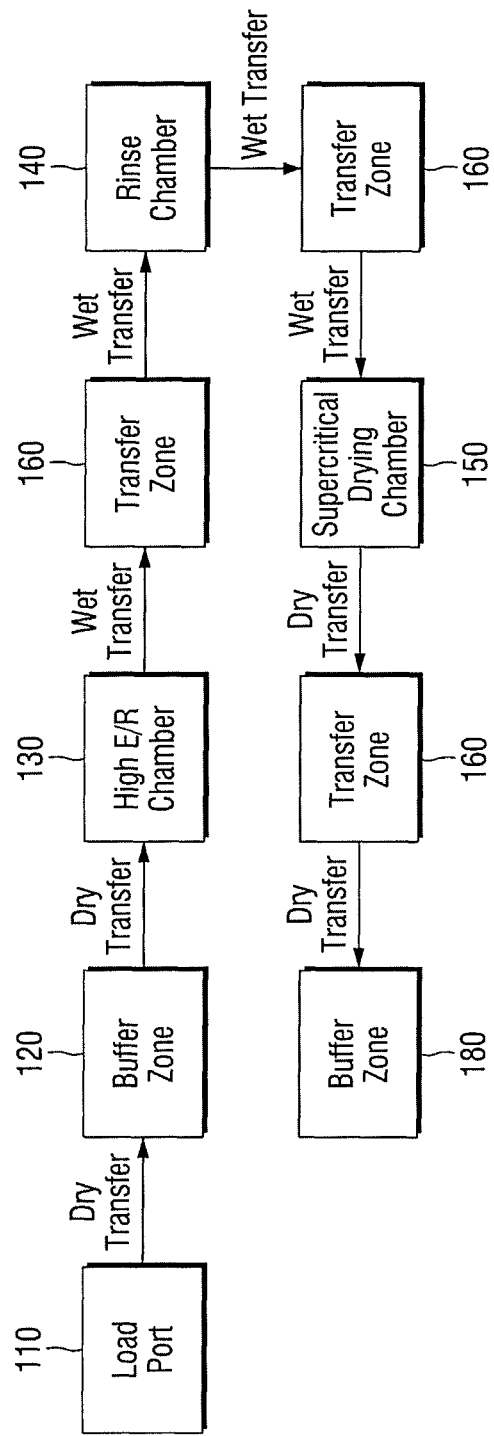
FIG. 3 illustrates a sequence of a wafer cleaning process performed by the multi-chamber apparatus according to the embodiments.

FIG. 3 illustrates the sequence of a wafer cleaning process performed by the multi-chamber apparatus according to the embodiments.

Referring to FIGS. 1 through 3, first, a wafer W may be located in the load port 110. The wafer W may be transferred to the buffer zone 120 by the second robot arm 172. Here, the transfer of the wafer W from the load port 110 to the buffer zone 120 may be a dry transfer in which the wafer W is transferred in a dry state.

Next, the wafer W may wait in the buffer zone 120 and then be transferred to the high etch rate chamber 130. Here, the wafer W may be transferred by the first robot arm 171. The transfer of the wafer W from the buffer zone 120 to the high etch rate chamber 130 may be a dry transfer in which the wafer W is transferred in a dry state. The wafer W may be transferred to the high etch rate chamber 130 via the transfer zone 160 or may be transferred directly from the buffer zone 120 to the high etch rate chamber 130. To transfer the wafer W directly from the buffer zone 120 to the high etch rate chamber 130, the first opening and closing portion 131 of the high etch rate chamber 130 may be formed or open toward the buffer zone 120, or there may be a separate opening and closing portion different from the first opening and closing portion 131 formed or open toward the transfer zone 160. In an implementation, the wafer W may be moved by the first holder 171a of the first robot arm 171.

Next, the wafer W that has gone through a process in the high etch rate chamber 130 may be transferred to the transfer zone 160. Here, the wafer W may be moved by the third holder 171c of the first robot arm 171. The transfer of the wafer W from the high etch rate chamber 130 to the transfer zone 160 may be a wet transfer in which the wafer W is transferred in a wet state.

Next, the wafer W may be transferred from the transfer zone 160 to the rinse chamber 140. In an implementation, the wafer W may be continuously moved by the third holder 171c of the first robot arm 171. The transfer of the wafer W from the transfer zone 160 to the rinse chamber 140 may be a wet transfer in which the wafer W is transferred in a wet state.

Next, the wafer W that has gone through a process in the rinse chamber 140 may be transferred again to the transfer zone 160. Here, the wafer W may be moved by the third holder 171c of the first robot arm 171. The transfer of the wafer W from the rinse chamber 140 to the transfer zone 160 may be a wet transfer in which the wafer W is transferred in a wet state.

Next, the wafer W may be transferred from the transfer zone 160 to the supercritical drying chamber 150. Here, the wafer W may be continuously moved by the third holder 171c of the first robot arm 171. The transfer of the wafer W from the transfer zone 160 to the supercritical drying chamber 150 may be a wet transfer in which the wafer W is transferred in a wet state.

Next, the wafer W that has gone through a process in the supercritical drying chamber 150 may be transferred again to the transfer zone 160. Here, the wafer W may be moved by the second holder 171b of the first robot arm 171. The transfer of the wafer W from the supercritical drying chamber 150 to the transfer zone 160 may be a dry transfer in which the wafer W is transferred in a dry state.

Next, the wafer W may be transferred from the transfer zone 160 to the buffer zone 120. In an implementation, the wafer W may be continuously moved by the second holder 171b of the first robot arm 171. The transfer of the wafer W from the transfer zone 160 to the buffer zone 180 may be a dry transfer in which the wafer W is transferred in a dry state.

In an implementation, the wafer W may be transferred from the buffer zone 120 back to the load port 110 by the second robot arm 172.

As described above, a part for performing a wet transfer and a part for performing a dry transfer may be strictly separated from each other in the driver 170. For example, the third holder 171c may be exclusively responsible for a wet transfer, and the first holder 171a, the second holder 171b and the second robot arm 172 may be responsible for a dry transfer. For example, it is possible to prevent a dried wafer W from getting wet again during a transfer.

A process performed on a wafer W in the high etch rate chamber 130 will now be described with reference to FIGS. 4 and 5.

Figure 4:
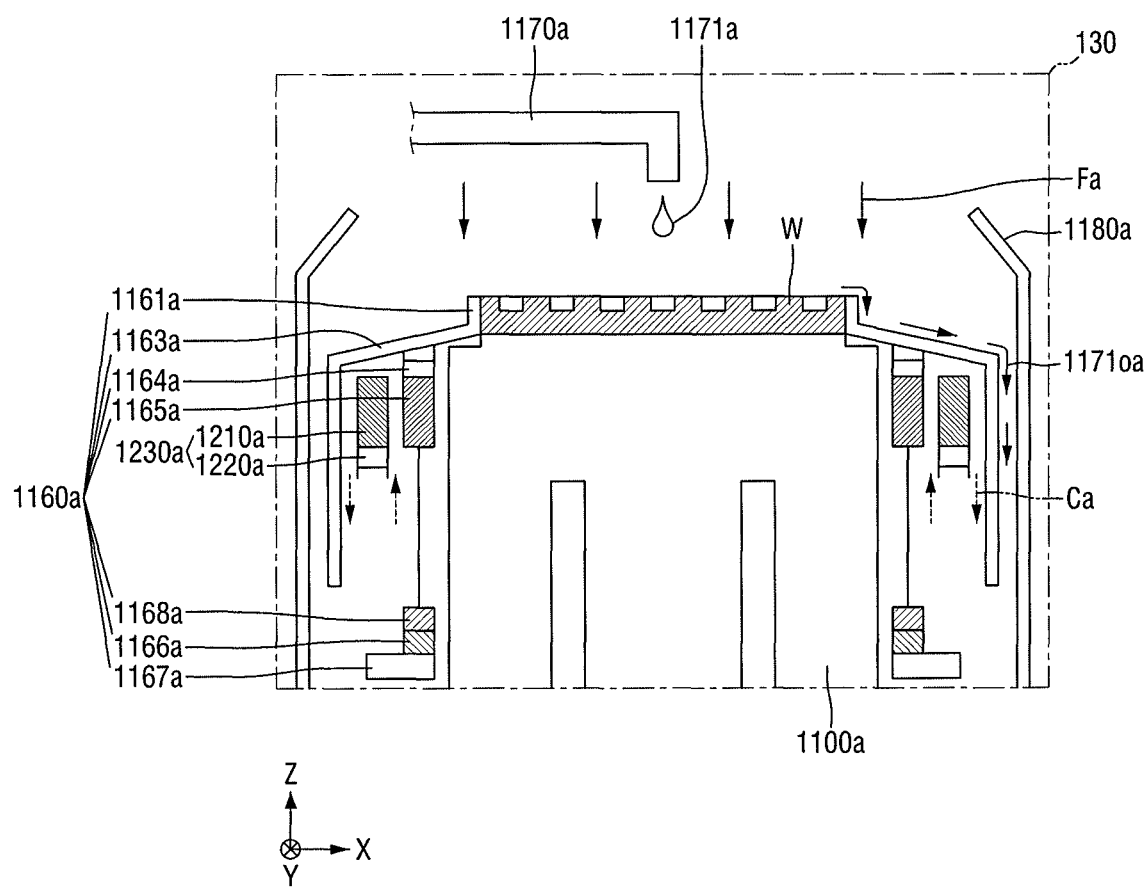
FIG. 4 illustrates a cross-sectional view of a high etch rate chamber of the multi-chamber apparatus according to the embodiments.

FIG. 4 illustrates a cross-sectional view of the high etch rate chamber 130 of the multi-chamber apparatus according to the embodiments. FIG. 5 illustrates a flowchart of a process performed in the high etch rate chamber 130 of the multi-chamber apparatus according to the embodiments.

First, referring to FIG. 4, the high etch rate chamber 130 may include a housing 1100a, a spinner 1160a, a nozzle 1170a, a bowl 1180a, and a fixing rotor module 1230a.

A first direction X may be any one of horizontal directions. A second direction Y may be any one of horizontal directions different from the first direction X. The second direction Y may intersect the first direction X. For example, the second direction Y may be perpendicular to the first direction X. A third direction Z may be a direction intersecting the first direction X and the second direction Y. For example, the third direction Z may be a direction perpendicular to both the first direction X and the second direction Y. The third direction Z may be, for example, a vertical direction. Accordingly, the first direction X, the second direction Y, and the third direction Z may be orthogonal to each other.

The housing 1100a may be located under a wafer W. For example, the housing 1100a and the wafer W may be successively arranged in the third direction Z. The housing 1100a may heat a lower surface of the wafer W. An upper surface of the housing 1100a may be adjacent to the lower surface of the wafer W.

The housing 1100a may fix and support the wafer W. In addition, the housing 1100a may heat the wafer W.

The spinner 1160a may include a grip portion 1161a, a chemical drain guide 1163a, a heat insulating block 1164a, a first rotor portion 1165a, a sidewall portion 1168a, a bearing 1166a, and a fixing portion 1167a.

The grip portion 1161a may be in contact with sides of the wafer W. The grip portion 116a may be fixed to the wafer W by directly contacting the sides of the wafer W. For example, the grip portion 1161a may rotate together with the wafer W.

The spinner 1160a may rotate the wafer W at a suitable speed. This is because if the rotational speed of the spinner 1160a were to be too high, an edge portion of the wafer W could relatively cooled, resulting in a non-uniform temperature distribution. In this case, an etch rate could also be different in a central portion and the edge portion of the wafer W.

The grip portion 1161a may include a heat insulating material. When the wafer W is heated by the housing 1100a, the grip portion 116a may block the transfer of heat, thereby preventing thermal damage to other parts of the high etch rate chamber 130.

The chemical drain guide 1163a may guide a drain path of a liquid chemical 1171a. The chemical drain guide 1163a may be connected to the grip portion 1161a. The liquid chemical 1171a may be pushed to the sides of the wafer W by a flow Fa after being used in an etching process on an upper surface of the wafer W.

Then, the liquid chemical 1171a may reach the chemical drain guide 1163a via the grip portion 1161a on the sides of the wafer W and become a discharge liquid chemical 1171oa. The discharge liquid chemical 1171oa may be discharged to the outside along the chemical drain guide 1163a.

The chemical drain guide 1163a may be located at a position lower than the bowl 1180a, and it may help prevent the liquid chemical 1171a and the discharge liquid chemical 1171oa from leaking to the outside. This can increase the durability of the high etch rate chamber 130 and prevent damage due to the discharge liquid chemical 1171oa.

In addition, the chemical drain guide 1163a may be further away from the wafer W than other elements of the spinner 1160a, e.g., the heat insulating block 1164a, the first rotor portion 1165a, the sidewall portion 1168a, the bearing 1166a, and the fixing portion 1167a. For example, the discharge liquid chemical 1171oa may be prevented from damaging the heat insulating block 1164a, the first rotor portion 1165a, the sidewall portion 1168a, the bearing 1166a, and the fixing portion 1167a.

The heat insulating block 1164a may constitute sidewalls of the spinner 1160a between the grip portion 1161a and the chemical drain guide 1163a. The heat insulating block 1164a may be made of a heat insulating material to block the heat received by the grip portion 1161a and the chemical drain guide 1163a from being transmitted to other elements of the spinner 1160a.

In an implementation, as illustrated in FIG. 4, the heat insulating block 1164a may be located at a position in direct contact with the grip portion 1161a and the chemical drain guide 1163a. In an implementation, the heat insulating block 1164a can be located at any position in the spinner 1160a as needed.

In an implementation, as illustrated in FIG. 4, the heat insulating block 1164a may be a single element. In an implementation, the heat insulating block 1164a may also be disposed as a plurality of elements in a plurality of parts.

The first rotor portion 1165a may rotate the spinner 1160a in a magnetic levitation manner, like a second rotor portion 1210a to be described below. The first rotor portion 1165a may be fixed to the heat insulating block 1164a, the sidewall portion 1168a, and the grip portion 1161a of the spinner 1160a, and the rotation of the first rotor portion 1165a may cause the entire spinner 1160a to rotate. For example, the wafer W may also rotate together with the spinner 1160a. Here, the housing 1100a may rotate together with the spinner 1160a, or only the spinner 1160a and the wafer W may rotate while the housing 1100a is fixed. If the housing 1100a is fixed, the wafer W and the housing 1100a may be spaced apart from each other.

The first rotor portion 1165a may include a magnetic substance. The first rotor portion 1165a may generate a rotational force through a magnetic force, together with the second rotor portion 1210a which also includes a magnetic substance.

The sidewall portion 1168a may be in contact with the first rotor portion 1165a to form the sidewalls of the spinner 1160a. In an implementation, as illustrated in FIG. 4, the sidewall portion 1168a may be located between the first rotor portion 1165a and the bearing 1166a. In an implementation, the sidewall portion 1168a may also include all portions constituting the sidewalls of the spinner 1160a. For example, the sidewall portion 1168a may be a single element as illustrated in FIG. 4 or may include a plurality of elements.

In an implementation, the bearing 1166a may be between the sidewall portion 1168a and the fixing portion 1167a. In an implementation, the bearing 1166a may be at any position between the fixing portion 1167a that is fixed and the first rotor portion 1165a that is rotated.

The bearing 1166a allows the spinner 1160a to rotate. For example, the bearing 1166a may be a minimum element for enabling the spinner 1160a to rotate even though the spinner 1160a includes the fixed fixing portion 1167a.

The bearing 1166a may rotate as the first rotor portion 1165a rotates. The bearing 1166a may simultaneously connect the fixing portion 1167a and the sidewall portion 1168a, the first rotor portion 1165a, the heat insulating block 1164a, the grip portion 1161a, and the chemical drain guide 1163a. Accordingly, the spinner 1160a may be rotated while being fixed.

The fixing portion 1167a may be in a lower part of the spinner 1160a to fix and support the spinner 1160a. The fixing portion 1167a may not rotate. Instead, the fixing portion 1167a may be connected to the bearing 1166a so as to allow a portion of the spinner 1160a to rotate.

Accordingly, some portions of the spinner 1160a excluding the fixing portion 1167a may rotate, thereby rotating the wafer W.

The nozzle 1170a may be located above the wafer W and the spinner 1160a. The nozzle 1170a may supply the liquid chemical 1171a to the upper surface of the wafer W. The nozzle 1170a may drop the liquid chemical 1171a onto the central portion of the wafer W. The wafer W may be rotated to spread the dropped liquid chemical 1171a over the entire upper surface of the wafer W. The high etch rate chamber 130 may apply the flow Fa downward (e.g., in the third direction Z) in order to spread the liquid chemical 1171a on the fixed wafer W. Accordingly, the liquid chemical 1171a may be moved from the center of the upper surface of the wafer W to the periphery.

In an implementation, as illustrated in FIG. 4, the nozzle 1170a may spray the liquid chemical 1171a downward above the upper surface of the wafer W. In an implementation, the nozzle 1170a may also be located on a side of the wafer W at a position higher than the upper surface of the wafer W. The nozzle 1170a may eject the liquid chemical 1171a in a lateral direction to supply the liquid chemical 1171a to the upper surface of the wafer W.

The liquid chemical 1171a may be supplied by the nozzle 1170a. The nozzle 1170a may eject the liquid chemical 1171a to the upper surface of the wafer W at an appropriate amount and speed. This is because if the liquid chemical 1171a were to be provided too much or too fast, a temperature rise of the wafer W may be delayed that much longer. The bowl 1180a may be located outside the wafer W, the spinner 1160a, and the housing 1100a. The bowl 1180a may extend in the third direction Z to a height higher than the upper surface of the wafer W. The bowl 1180a may block the outflow of the liquid chemical 1171a and fumes produced by vaporization of the liquid chemical 1171a. The bowl 1180a may help prevent other parts of the high etch rate chamber 130 from being damaged by the liquid chemical 1171a and the fumes.

The fixing rotor module 1230a may be spaced apart from the spinner 1160a. The fixing rotor module 1230a may surround the spinner 1160a. In an implementation, the fixing rotor module 1230a may be located between the chemical drain guide 1163a and the first rotor portion 1165a.

The fixing rotor module 1230a may include the second rotor portion 1210a and a rotor support portion 1220a. The second rotor portion 1210a may rotate the spinner 1160a in a magnetic levitation manner, like the first rotor portion 1165a described above. The second rotor portion 1210a may be spaced apart from the heat insulating block 1164a, the sidewall portion 1168a, and the grip portion 1161a of the spinner 1160a. In addition, the second rotor portion 1210a is connected to the rotor support portion 1220a.

The second rotor portion 1210a may include a magnetic substance. The second rotor portion 1210a may generate a rotational force through a magnetic force, together with the first rotor portion 1165a.

The above configuration of the high etch rate chamber 130 is an example, and may be modified.

Figure 5:
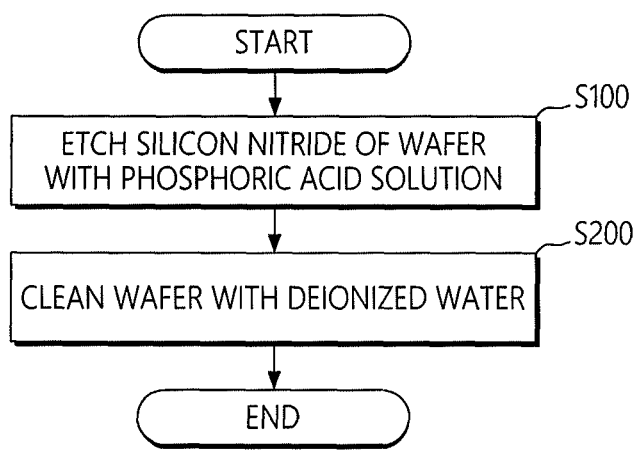
FIG. 5 illustrates a flowchart of a process performed in the high etch rate chamber of the multi-chamber apparatus according to the embodiments.

Referring to FIGS. 4 and 5, the high etch rate chamber 130 etches silicon nitride of a wafer with a phosphoric acid solution (operation S100).

For example, the silicon nitride may be a sacrificial layer or an etch stop layer in a semiconductor manufacturing process. The silicon nitride may be etched by the phosphoric acid solution.

The high etch rate chamber 130 may remove most of the silicon nitride, and a cleaning process may be performed at a high temperature. For example, the phosphoric acid solution may be supplied at a high temperature of 150° C. to 300° C.

Referring to FIG. 4, the liquid chemical 1171*a* supplied by the nozzle 1170*a* may be the phosphoric acid solution.

Next, referring again to FIG. 5, the wafer may be cleaned with deionized wafer (operation S200).

For example, referring to FIG. 4, when most of the silicon nitride of the wafer W is etched by the phosphoric acid solution, the high etch rate chamber 130 may clean the wafer W by supplying deionized water to the wafer W. Accordingly, when the wafer W is taken out of the high etch rate chamber 130, it may be in a wet state.

A process performed on a wafer W in the rinse chamber 140 will now be described with reference to FIGS. 6 and 7.

Figure 6:
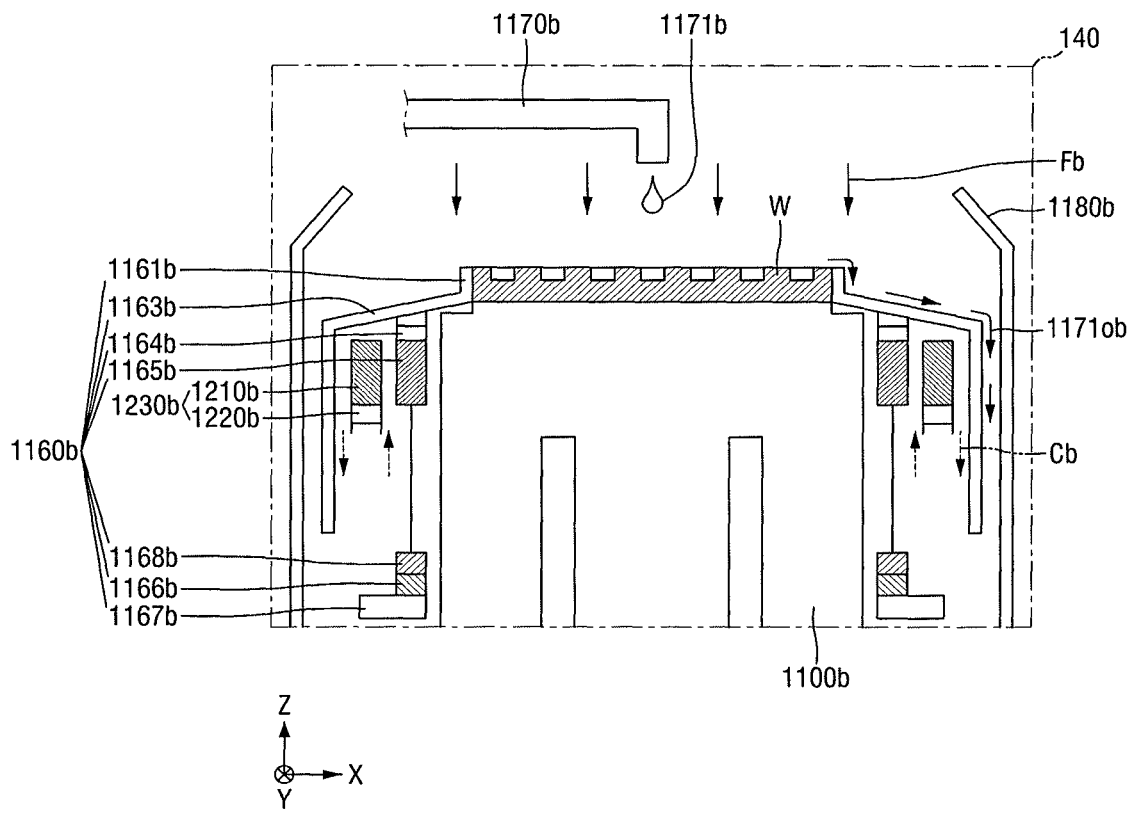
FIG. 6 illustrates a cross-sectional view of a rinse chamber of the multi-chamber apparatus according to the embodiments.

FIG. 6 illustrates a cross-sectional view of the rinse chamber 140 of the multi-chamber apparatus according to the embodiments. FIG. 7 illustrates a flowchart of a process performed in the rinse chamber 140 of the multi-chamber apparatus according to the embodiments.

First, referring to FIG. 6, the rinse chamber 140 may include a housing 1100*b*, a spinner 1160*b*, a nozzle 1170*b*, a bowl 1180*b*, and a fixing rotor module 1230*b*. In an implementation, the housing 1100*b*, the spinner 1160*b*, the nozzle 1170*b*, the bowl 1180*b* and the fixing rotor module 1230*b* of FIG. 6 may have the same or similar structure as the housing 1100*a*, the spinner 1160*a*, the nozzle 1170*a*, the bowl 1180*a* and the fixing rotor module 1230*a* of FIG. 4, respectively.

In the rinse chamber 140, a flow Fb may be applied to an upper surface of a wafer W, and a liquid chemical 1171*b* may be supplied from the nozzle 1170*b*. The liquid chemical 1171*b* may become a discharge liquid chemical 1171*ob* discharged along a chemical drain 1163*a*.

The spinner 1160*b* may include a grip portion 1161*b*, the chemical drain guide 1163*b*, a heat insulating block 1164*b*, a first rotor portion 1165*b*, a sidewall portion 1168*b*, a bearing 1166*b*, and a fixing portion 1167*b*. The function of the spinner 1160*b* is the same as that of the spinner 1160*a* of FIG. 4 and thus will not be described for the sake of convenience.

The structure of the rinse chamber 140 illustrated in FIG. 6 is an example, and may be modified.

Figure 7:
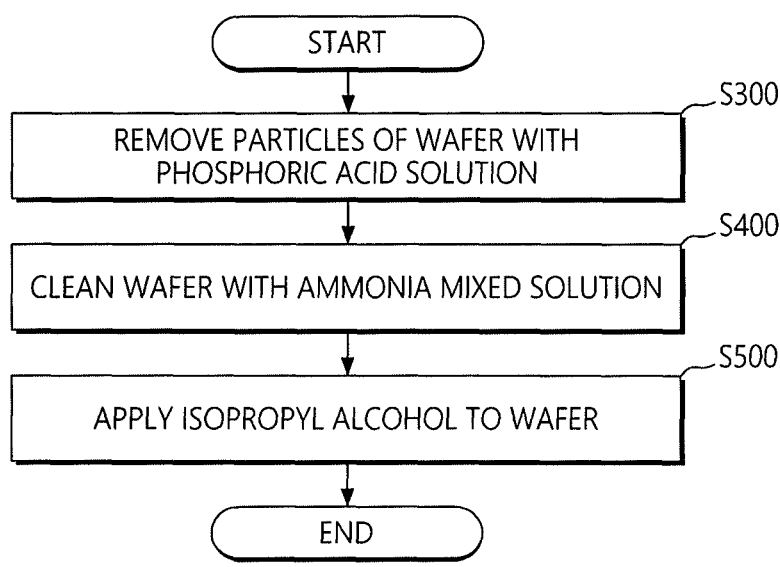
FIG. 7 illustrates a flowchart of a process performed in the rinse chamber of the multi-chamber apparatus according to the embodiments.

Referring to FIGS. 6 and 7, the rinse chamber 140 may remove particles of a wafer with a phosphoric acid solution (operation S300).

For example, referring to FIG. 6, silicon nitride of the wafer W may remain on the wafer W without being completely etched in the high etch rate chamber 130, or particles of other materials may remain on the wafer W. Accordingly, the rinse chamber 140 may supply a phosphoric acid solution again through the nozzle 1170*b* as the liquid chemical 1171*b* in order to remove these particles.

Next, referring again to FIG. 7, the wafer may be cleaned with an ammonia mixed solution (operation S400).

For example, referring to FIG. 6, after etching the silicon nitride of the wafer W once more with the phosphoric acid solution, the rinse chamber 140 may clean the wafer W by supplying an ammonia mixed solution to the wafer W. In an implementation, the ammonia mixed solution may include, e.g., $NH_4OH:H_2O_2:H_2O$.

The temperature of the ammonia mixed solution may be, e.g., higher than or equal to ambient (room) temperature (e.g., about 20° C.) or may be 150° C. or below. For example, the rinse chamber 140 may perform a process at a lower temperature than the high etch rate chamber 130.

Next, referring again to FIG. 7, isopropyl alcohol may be applied to the wafer (operation S500).

For example, referring to FIG. 6, the rinse chamber 140 may apply isopropyl alcohol to the wafer W through the nozzle 1170*b* for pretreatment prior to a supercritical drying process. In an implementation, a new nozzle different from the existing nozzle 1170*b* may be used to prevent chemicals from being mixed with each other.

For example, when the wafer W is taken out of the rinse chamber 140, the wafer W may be in the wet state.

A process performed on a wafer W in the supercritical drying chamber 150 will now be described with reference to FIGS. 8 and 9.

Figure 8:
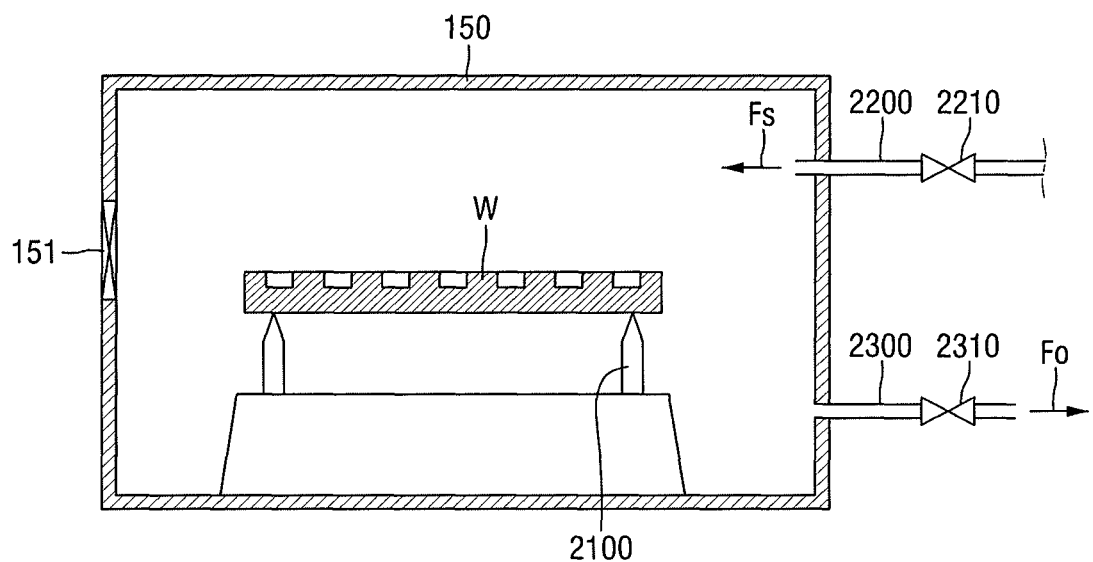
FIG. 8 illustrates a cross-sectional view of a supercritical drying chamber of the multi-chamber apparatus according to the embodiments.

FIG. 8 illustrates a cross-sectional view of the supercritical drying chamber 150 of the multi-chamber apparatus according to the embodiments. FIG. 9 illustrates a flowchart of a process performed in the supercritical drying chamber 150 of the multi-chamber apparatus according to the embodiments.

First, referring to FIG. 8, the supercritical drying chamber 150 may include the third opening and closing portion 151, a support 2100, a fluid inlet 2200, a first valve 2210, a fluid outlet 2300, and a second valve 2310.

The third opening and closing portion 151 may be a passage through which a wafer W is put into the supercritical drying chamber 150. The third opening and closing portion 151 may normally be closed to keep the supercritical drying chamber 150 sealed. When the wafer W is put into or removed from the supercritical drying chamber 150, the third opening and closing portion 151 may be temporally opened to allow the wafer W to pass through it.

The support 2100 may support the wafer W. The wafer W may be dried while being fixed by the support 2100. In an implementation, the support 2100 may minimize a contact surface with the wafer W.

The fluid inlet 2200 may supply a supercritical fluid into the supercritical drying chamber 150. A supercritical fluid flow Fs may reach the wafer W inside the supercritical drying chamber 150 through the fluid inlet 2200.

The first valve 2210 may control the opening and closing of the fluid inlet 2200. For example, the first valve 2210 may be opened when the supercritical fluid is supplied and may be closed when the supply of the supercritical fluid ends.

The fluid outlet 2300 may allow the supercritical fluid to be discharged from the supercritical drying chamber 150 to the outside. A supercritical fluid discharge Fo may be achieved through the fluid outlet 2300.

The second valve 2310 may control the opening and closing of the fluid outlet 2300. For example, the second valve 2310 may be opened when the supercritical fluid is discharged and may be closed when the discharge of the supercritical fluid ends.

Figure 9:
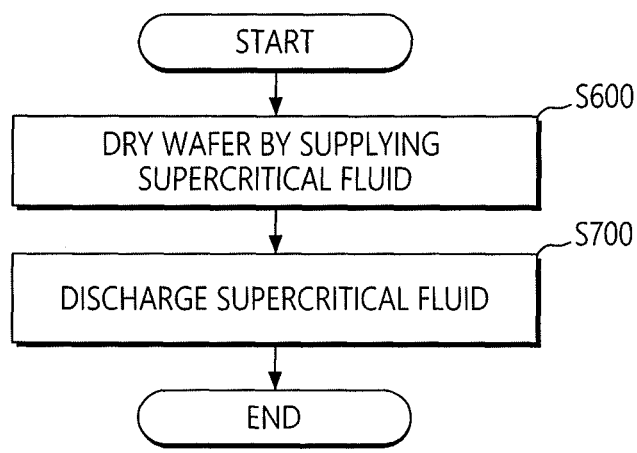
FIG. 9 illustrates a flowchart of a process performed in the supercritical drying chamber of the multi-chamber apparatus according to the embodiments.

Referring to FIG. 9, the supercritical drying chamber 150 may dry a wafer by supplying a supercritical fluid (operation S600).

For example, referring to FIG. 8, the first valve 2210 may be opened to allow the supercritical fluid flow Fs to be applied to the wafer W inside the supercritical drying chamber 150 through the fluid inlet 2200. Accordingly, the wafer W wet with isopropyl alcohol may be dried.

Next, referring again to FIG. 9, the supercritical fluid may be discharged (operation S700).

For example, referring to FIG. 8, the second valve 2310 may be opened to allow the supercritical fluid discharge Fo to flow out of the supercritical drying chamber 150 through the fluid outlet 2300.

A multi-chamber apparatus according to embodiments will now be described with reference to FIGS. 2, 10, and 11. A repeated description of elements and features identical to those of the above-described embodiments may be omitted or given briefly.

Figure 10:
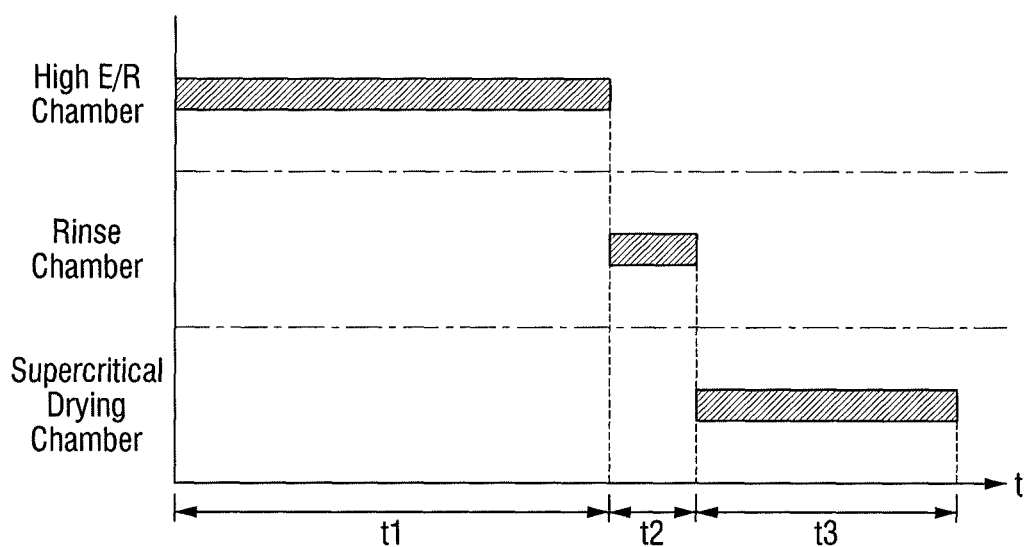
FIG. 10 illustrates a graph comparing a process time of each chamber of a multi-chamber apparatus according to embodiments.

FIG. 10 illustrates a graph comparing a process time of each chamber of a multi-chamber apparatus according to embodiments. FIG. 11 illustrates a plan view of a multi-chamber apparatus according to embodiments.

Referring to FIG. 10, a process in a high etch rate chamber 130 may be performed for a first time t1, a process in a rinse chamber 140 may be performed for a second time t2, and a process in a supercritical drying chamber 150 may be performed for a third time t3.

In an implementation, the first time t1 may be longer than the second time t2 and the third time t3. In an implementation, the third time t3 may be longer than the second time t2 but shorter than the first time t1. For example, the process performed in the high etch rate chamber 130 may be the longest, and the process performed in the rinse chamber 140 may be the shortest. In an implementation, a ratio of the first time t1, the second time t2 and the third time t3 may be, e.g., 5:1:3.

In an implementation, the ratio of the number of the high etch rate chambers 130, the number of the rinse chambers 140, and the number of the supercritical drying chambers 150 may be changed to a more efficient ratio than 1:1:1.

Figure 11:
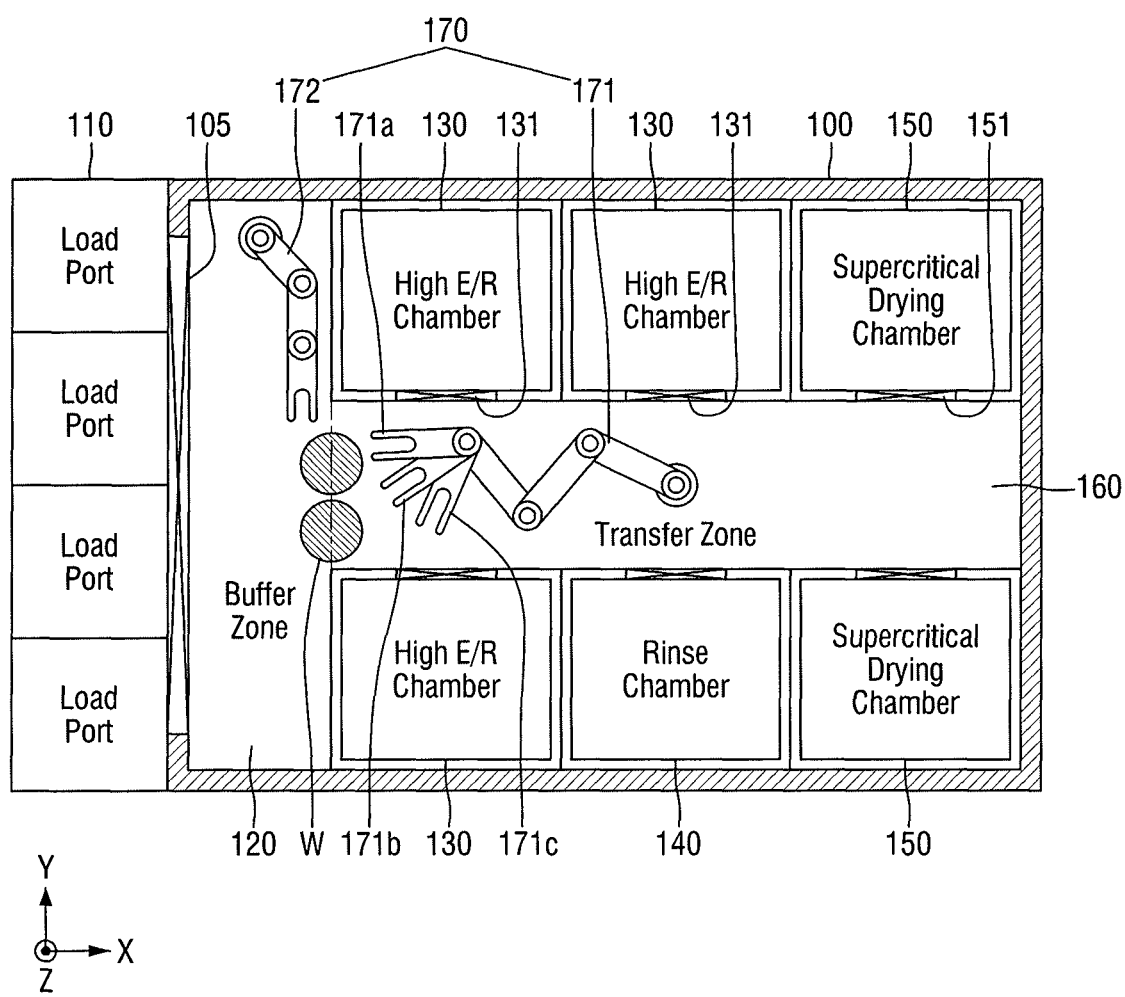
FIG. 11 illustrates a plan view of a multi-chamber apparatus according to embodiments.

In an implementation, as illustrated in FIGS. 2 and 11, in the multi-chamber apparatus, the ratio of the number of the high etch rate chambers 130, the number of the rinse chambers 140, and the number of the supercritical drying chambers 150 may be, e.g., 3:1:2.

For example, as illustrated in FIGS. 2 and 11, six high etch rate chambers 130, two rinse chambers 140, and four supercritical drying chambers 150 may be provided. This is to efficiently reduce the process time by considering the size limitation of each chamber.

A multi-chamber apparatus according to embodiments will now be described with reference to FIGS. 11 and 12. A repeated description of elements and features identical to those of the above-described embodiments may be omitted or given briefly.

Figure 12:
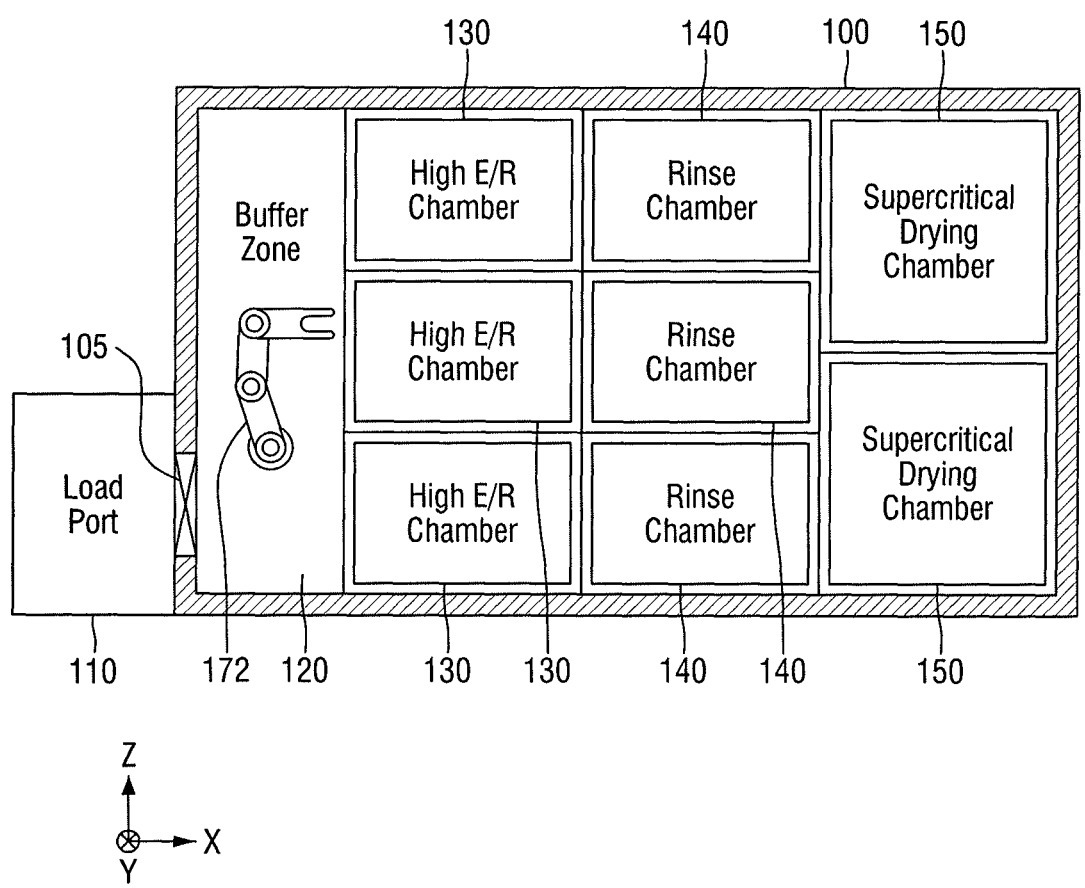
FIG. 12 illustrates a side view of a multi-chamber apparatus according to embodiments.

FIG. 12 illustrates a side view of a multi-chamber apparatus according to embodiments. FIG. 12 is a side layout of a multi-chamber apparatus whose chambers arranged in plan view as illustrated in FIG. 11 are stacked in the third direction Z.

Referring to FIGS. 11 and 12, a vertical size of a supercritical drying chamber 150 may be larger than that of a high etch rate chamber 130 or a rinse chamber 140. In view of these limitations, the ratio of the number of the high etch rate chambers 130, the number of the rinse chambers 140 and the number of the supercritical drying chambers 150 may be, e.g., 9:3:4, in the multi-chamber apparatus according to the embodiments.

For example, the high etch rate chambers 130 and the rinse chambers 140 may be stacked in three tiers in the third direction Z, and the supercritical drying chambers 150 may be stacked in two tiers. Accordingly, nine high etch rate chambers 130, three rinse chambers 140, and four supercritical drying chambers 150 may be included in the multi-chamber apparatus.

In an implementation, the number of the high etch rate chambers 130, the number of the rinse chambers 140 and the number of the supercritical drying chambers 150 may also be 18, 6, and 8, respectively.

In an implementation, the number of the high etch rate chambers 130 may be increased when the etch rate of the high etch rate chambers 130 is reduced. This may improve the efficiency of a wafer cleaning process, thereby increasing the yield.

A multi-chamber apparatus according to embodiments will now be described with reference to FIG. 13. A repeated description of elements and features identical to those of the above-described embodiments may be omitted or given briefly.

Figure 13:
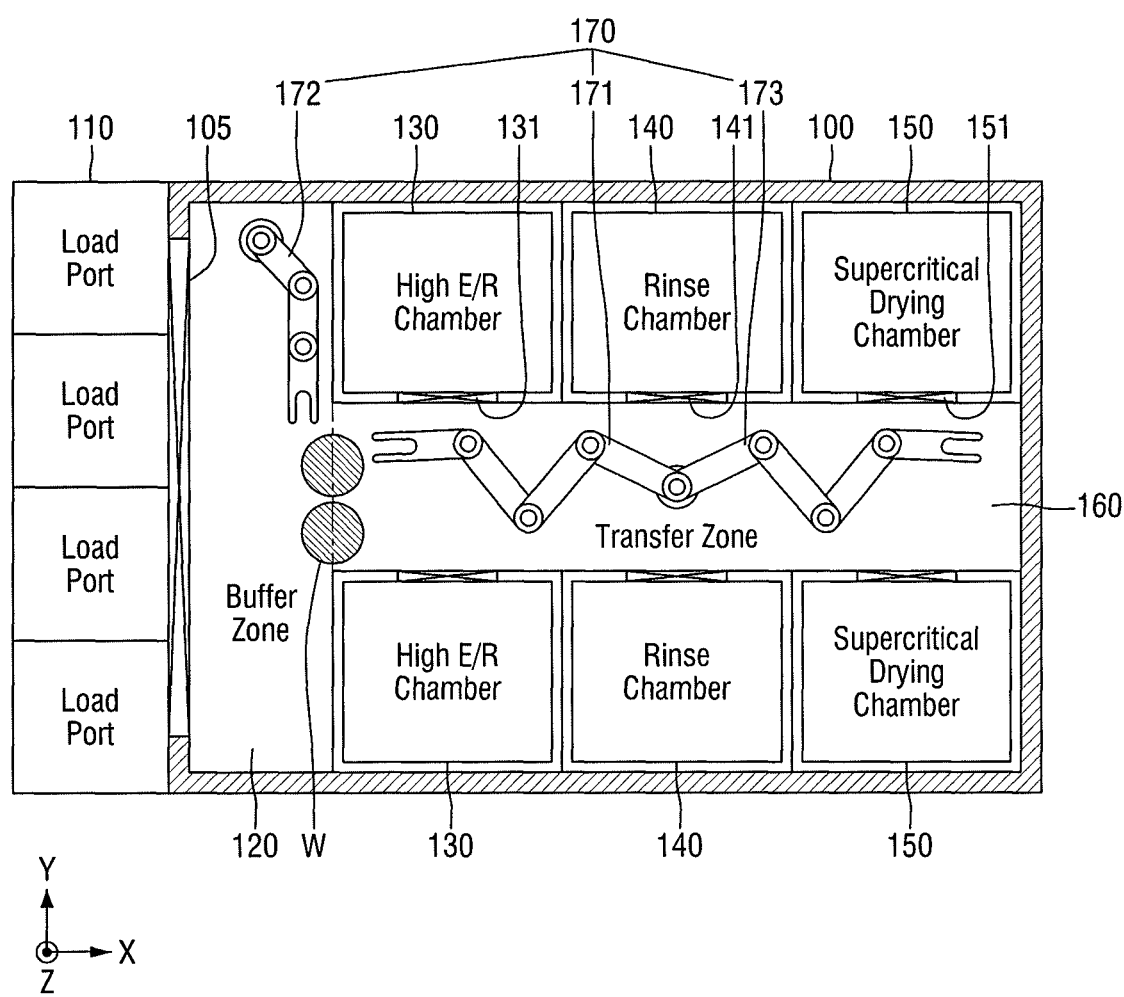
FIG. 13 illustrates a plan view of a multi-chamber apparatus according to embodiments.

FIG. 13 illustrates a plan view of a multi-chamber apparatus according to embodiments.

Referring to FIG. 13, a driver 170 of the multi-chamber apparatus according to the embodiments may include a third robot arm 173.

Both a first robot arm 171 and the third robot arm 173 may move a wafer W in a transfer zone 160. The first robot arm 171 may perform a dry transfer, e.g., may move a dry wafer W. For example, the first robot arm 171 may move the wafer W from a buffer zone 120 to a high etch rate chamber 130 via the transfer zone 160 and transfer the wafer W from a supercritical drying chamber 150 to the buffer zone 120 via the transfer zone 160.

The third robot arm 173 may perform a wet transfer, e.g., may move a wet wafer W. For example, the third robot arm 173 may move the wafer W from the high etch rate chamber 130 to a rinse chamber 140 via the transfer zone 160 and move the wafer W from the rinse chamber 140 to the supercritical drying chamber 150 via the transfer zone 160.

According to an embodiment, two robot arms may respectively perform a dry transfer and a wet transfer, contamination of a wafer W may be more reliably prevented, and the efficiency of wafer movement may be significantly improved.

One or more embodiments may provide a multi-chamber apparatus capable of successively performing a wafer cleaning process and a supercritical drying process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor, the method comprising:
   moving a wafer in a high etch rate chamber of a multi-chamber apparatus;
   etching silicon nitride of the wafer with a first phosphoric acid solution in the high etch rate chamber;
   moving the wafer from the high etch rate chamber to a rinse chamber of the multi-chamber apparatus;
   cleaning the wafer with an ammonia mixed solution in the rinse chamber;

moving the wafer from the rinse chamber to a supercritical drying chamber of the multi-chamber apparatus; and drying the wafer with a supercritical fluid in the supercritical drying chamber, wherein:

a process time of the high etch rate chamber is a first time, a process time of the rinse chamber is a second time, a process time of the supercritical drying chamber is a third time, a ratio of the first time, the second time, and the third time is 5:1:3, and a temperature of the ammonia mixed solution is 50° C. to 150° C.

2. The method as claimed in claim 1, further comprising cleaning the wafer with deionized water in the high etch rate chamber after the wafer is etched with the first phosphoric acid solution.

3. The method as claimed in claim 1, further comprising cleaning the wafer with isopropyl alcohol in the rinse chamber after the wafer is cleaned with the ammonia mixed solution.

4. The method as claimed in claim 1, further comprising removing a particle of the wafer with a second phosphoric acid solution in the rinse chamber before the wafer is cleaned with the ammonia mixed solution.

5. The method as claimed in claim 1, wherein:

the multi-chamber apparatus comprises n high etch rate chambers, m rinse chambers, and i supercritical drying chambers, n, m, and i are natural numbers, n is greater than i, and i is greater than m.

6. The method as claimed in claim 5, wherein:

n is 3, m is 1, and i is 2.

7. The method as claimed in claim 5, wherein:

n is 9, m is 3, and i is 4.

8. The method as claimed in claim 1, wherein the ammonia mixed solution contains $NH_4OH$, $H_2O_2$, and $H_2O$.

* * * * *